Sept. 2, 1958 R. M. TILLMAN 2,850,631

FREQUENCY MODULATING TRANSDUCER

Filed June 29, 1956

INVENTOR.
ROBERT M. TILLMAN
BY
Charles F. Carroll Jr.
ATTORNEY 2,850,631

FREQUENCY MODULATING TRANSDUCER

Robert M. Tillman, Willow Grove, Pa., assignor to Burroughs Corporation, Detroit, Mich., a corporation of Michigan Application June 29, 1956, Serial No. 594,770
5 Claims. (Cl. 250—36)

This invention relates to transducers and more particularly concerns a radio frequency, frequency modulating transducer for restricted mounting and severe operating conditions as a telemetering sub-carrier oscillator.

In many fields of research and development such as nuclear physics, atomic energy and guided missiles, measurements are required from places which are either inaccessible or dangerous to occupy. For such measurements, the basic parameter is converted to some form of data which can be transmitted to a remote station. The device for doing this is known as a transducer.

A very convenient form of transducer is an oscillator modulated by the measured information. Because of its low-noise characteristics, frequency modulation is widely used in such transducers. The frequency modulated carrier from such a transducer can be used directly in a telemetering system, but much more data can be transmitted if each transducer's carrier is a low-frequency sub-carrier which in turn frequency modulates a higher-frequency carrier. Such a device is known as a telemetering sub-carrier oscillator. When some phenomenon can modulate this oscillator, it is a transducer for measuring that phenomenon.

When available space for mounting a transducer is limited, and operating conditions of limited power, vibration, and temperature variation are severe, then transistor circuits may be advantageous. However, many problems exist, such as the bulk of inductances and capacitors suitable for the low frequency of sub-carriers, the limited range of linear frequency variation in a low frequency resonant circuit, the different impedance characteristics of transistors as contrasted to vacuum tubes which prevents a direct analog transfer from known tube circuits, and oscillator "pull-in" effects between two oscillators, which have impeded the development of suitable miniature telemetering sub-carrier transducers.

An object of this invention is to provide a compact telemetering sub-carrier oscillator.

Another object of this invention is to provide a miniaturized telemetering sub-carrier oscillator having very low power requirements.

A further object of this invention is to provide a stabilized and miniaturized telemetering sub-carrier oscillator of very low power requirements.

Generally, in accordance with this invention similar transistor oscillators generate high frequency signals which are heterodyned and amplified in another transistor circuit, and the resonant frequency of one oscillator is modulated by the parameter to be measured, to produce a frequency modulation of the heterodyne signal output.

For a more detailed description of this invention, reference is made to the drawings in which.

Figure 1:
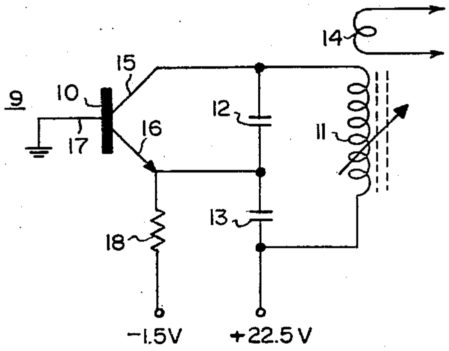
Figure 1 is a schematic diagram of a frequency modulated oscillator.

In Figure 1 is shown a simple oscillator. An n-p-n transistor 10 is coupled to capacitors 12 and 13 which in turn are connected to inductance 11 to provide a resonant circuit. Inductance 11 is varied by movement of a core or by variations of an air gap. This movement is generated by a Bourdon tube or other type pressure device. A bias voltage of −1.5 volts is applied through resistor 18 to produce current from emitter 16 and establish operating conditions. A further voltage supply such as +22.5 volts is applied through inductance 11 to the collector 15 and provides current as controlled by the emitter 16. Base 17 is common to both circuits. Regenerative feed back is provided by a portion of the alternating voltage appearing across capacitor 13, and the degree of feedback depends upon the ratio of capacitor 12 to capacitor 13 to provide a capacitative voltage divider. This is the type oscillator generally described on pages 373–375 and shown in Figure 10–31(*d*), of "Transistor Electronics," by Lo, Endres, Zowels, Waldhaner and Cheng, published by Prentice-Hall in 1955.

When oscillator 9 is used for generating a telemetering sub-carrier, the engineer is immediately confronted with several limitations. Standard FM/FM telemetering channels cover the range of from 0.4–70 kilocycles. These frequencies require large and heavy coils for inductance 11 and equally large capacitors 12 and 13, in accordance with the equation:

$$f=\frac{1}{2\pi\sqrt{LC}}$$

where
$f$=frequency in cycles/second
$L$=inductance in henries
$C$=capacity in farads For example, for a sub-carrier frequency of 20 kilocycles and capacitors 12 and 13 both 500 micro-microfarads, the inductance 11 must be about 250 millihenries. These units must be low-loss units, in order to provide the hi "Q" which a frequency stable resonant circuit requires; and such low loss units are large and heavy for the values stated.

An additional limitation arises in that a frequency variation of only a few thousand cycles represents a large percentage change. Conversely, the frequency changes which can be produced in variable inductance 11 by movable cores, etc., are only a few hundred cycles and depart rapidly from a linear relation to the motion or parameter causing the change through pressure bellows, etc.

Accordingly, the telemetering sub-carrier oscillator of Figure 1 would not be useful where very little weight and bulk can be tolerated, and where a linear, wide-range transducer is required.

Figures 2, 3:
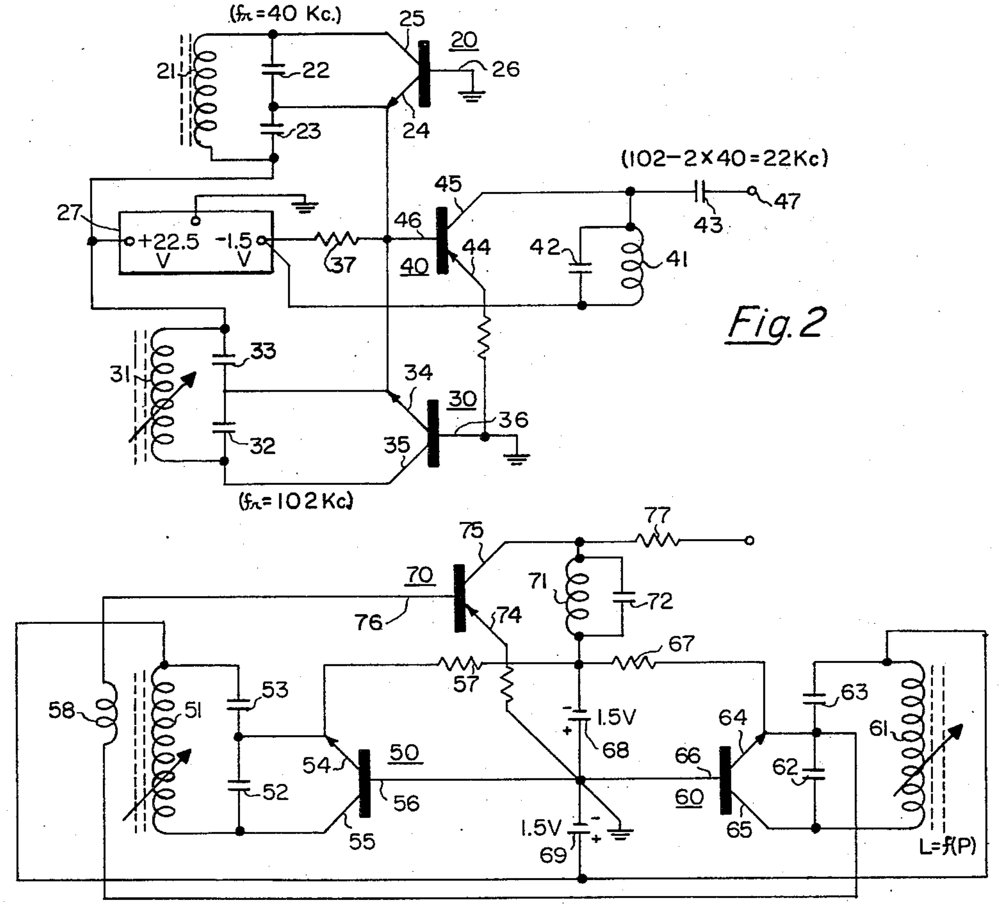
Figure 2 is a schematic circuit diagram of similar transistor oscillators and a mixer to provide a sub-carrier output.
Figure 3 is a schematic circuit diagram of another embodiment of similar transistor oscillators and mixer.

The requirement was met in a highly useful telemetering sub-carrier oscillator of small size and light weight, in the circuit of Figure 2. Transistor 20 is an n-p-n type in a common base oscillator circuit as shown in Figure 1. Inductance 21 and capacitors 22 and 23 provide the resonant circuit. The connection between capacitors 22 and 23 provides the alternating voltage tap for emitter 24, with resistor 37 providing the emitter-biasing current path. Collector 25 connects to one end of inductance 21 while base 26 is grounded, and through voltage supply 27 is effectively connected to the other end of inductance 21 for flow of radio-frequency currents. Since resistor 37 is not by-passed with a capacitor, the radio-frequency voltages across capacitor 23 will appear substantially across resistor 37. Capacitors 22 and 23 and resistor 37 are adjusted to optimize the second harmonic voltage across resistor 37, for reasons which will be described. Transistor 30 is connected in another oscillator which is practically identical to the circuit for transistor 20. Inductance 31 and capacitors 32 and 33 provide a resonant circuit, with emitter 34 connected to the junction between them and to common resistor 37. Collector 35 connects to one end of inductance 31 and base 36 connects to ground and through supply 27 to the other end of inductance 31. The resonant circuit for transistor 30 is tuned to be the sub-carrier frequency different from the second harmonic of the resonant circuit for transistor 20. With this large and non-harmonic frequency difference between the two oscillators, there is no "pull" between oscillators; yet they put two alternating voltages on resistor 37 which differ in frequency by the sub-carrier frequency.

Transistor 40 is a p-n-p type in a common emitter amplifier connection receiving its input on base 46 from resistor 37. Emitter 44 is grounded, and collector 45 connects to inductance 41 and capacitor 42, tuned fairly broadly to the desired sub-carrier frequency. Capacitor 43 and terminal 47 are for coupling to the high-frequency telemetering transmitter or other output-using device. With emitter 44 grounded, emitter 44 is positive relative to the base 46. This causes an p-n-p transistor to be very non-linear in its response to signals applied to base 46, rectifying and then amplifying the products of this rectification. This output appears on collector 45. With the second harmonic of the oscillation frequency of transistor 20 and the oscillation frequency of transistor 30 both appearing across resistor 37 and hence applied to base 46 of transistor 40, and with these alternating voltages differing by the sub-carrier, the output on terminal 47 is the sub-carrier. Inductor 31 is varied by the parameter being measured, such as through a bellows or Bourdon tube moving a core of magnetic material, to frequency modulate this sub-carrier output. In a typical system, transistor 20 oscillates at 40 kilocycles, producing a second harmonic of 80 kilocycles across resistor 37, and transistor 30 oscillates at 102 kilocycles which produces this frequency across resistor 37. Their difference, or 22 kilocycles, is produced by a heterodyning process in the rectification by transistor 40 and appears in amplified form on terminal 47. Coil 41 and capacitor 42 must resonate at 22 kc., but are not high "Q"; so they can be compact and light components. Further, variation of inductance 31 produces a small-percentage but nearly linear variation around the 102 kc. frequency, and this will produce changes in the heterodyning action with the 80 kc. signal into a still-linear but much greater percentage variation in the 22 kc. difference frequency. In this manner, an entire telemetering sub-carrier transducer has been provided in a space-weight requirement about the same as required for only inductance 11 of the simple unit. With the oscillators being very similar in construction, their temperature/frequency drift characteristics are nearly identical, so their frequency difference remains substantially constant over a wide temperature range.

Another embodiment is shown in Fig. 3, utilizing two similar oscillators whose fundamental frequencies differ by the sub-carrier frequency. Transistors 50 and 60 are in oscillator circuits as described for Figs. 1 and 2, except that the resistance determining emitter biasing current is separate for each oscillator, resistors 57 and 67 respectively. The resonant frequency determined by inductance 51 and capacitors 52 and 53 is about 100 kc., and the resonant frequency determined by inductance 61 and capacitors 62 and 63 is about 122 kc.

Some voltage at each of these frequencies is applied to base 76 of transistor 70. The voltage from transistor 50 is by inductive coupling of coil 58, and the voltage from transistor 60 is by capacitive coupling from the junction of capacitors 62 and 63. Both couplings could be either inductive or capacitive or other forms which will occur to those skilled in the art. The coefficient of coupling must be kept small, to avoid interaction.

Transistor 70 is a p-n-p type, to which the voltage of common voltage supplies 68 and 69 are a bias, making transistor 70 nonlinear. This causes transistor 70 to rectify the alternating voltages applied on base 76 to amplify the voltage of whatever frequency finds a high impedance across inductance 71 and capacitor 72. In this case, inductance 71 and capacitor 72 are broadly tuned to the difference between the frequencies applied on base 76, that is, to the sub-carrier frequency. Inductance 61 is varied by movement of a core or other inductance varying device as described for inductances 11 and 31, to produce a frequency modulation representative of the parameter being measured. A preferred method is a Bourdon tube responding to pressure to move a magnetic core and thus vary the inductance.

With both oscillators on fundamental frequencies which are not widely separated, their physical similarity can be much closer than when one oscillator is at a much lower frequency as in Fig. 2. Accordingly, the embodiment of Fig. 3 provides enchanced temperature stability of the sub-carrier, because the thermal drift characteristics of oscillators 50 and 60 are practically identical and their frequency difference remains constant. In all embodiments of the invention, both oscillators tend to vary their frequencies in the same direction and order of magnitude with any supply voltage variation, thus maintaining a substantially constant beat frequency. However, both the circuits of Fig. 2 and Fig. 3 are well within a useful range of performance in this respect.

There are thus provided compact and stable frequency modulated transducers requiring very little power input and providing a modulated sub-carrier frequency for use in a multi-channel telemetering system. Performance is completely satisfactory for a precision-type transducer in a laboratory telemetering measurement system.

What is claimed is:

1. A sub-carrier transducer comprising a first resonant circuit tuned to a first frequency, a first transistor connected to said first resonant circuit to produce a first oscillating voltage therein, a second resonant circuit tuned to a second frequency, a second transistor connected to said second resonant circuit to produce a second oscillating voltage therein, a third resonant circuit tuned substantially to the difference between said first and second frequencies, a third transistor connected to said third resonant circuit to heterodyne voltages applied thereto and to amplify voltages at said difference frequency, coupling means between said transistors to apply said oscillating voltages to said third transistor, voltage supply means applying operating voltage to said first and second transistors and a bias voltage to said third transistor, and reluctance varying means associated with one of said first and second resonant circuits to vary the frequency thereof.

2. A subcarrier transducer comprising a first resonant circuit tuned to a first frequency, a first transistor connected to said first resonant circuit to produce a first oscillating voltage therein, a second resonant circuit tuned to a second frequency, a second transistor connected to said second resonant circuit to produce a second oscillating voltage therein, a third resonant circuit broadly tuned to a third frequency, a third transistor connected to said third resonant circuit to heterodyne voltages applied thereto and to amplify voltages substantially at the frequency of said third resonant circuit; coupling means between said transistors to apply said oscillating voltages to said third transistor, voltage supply means applying operating voltages to said first and second transistors and a bias voltage to said third transistor and means associated with said second resonant circuit for varying the frequency thereof.

3. A transducer comprising: a parallel circuit having a first resonant frequency, said first resonant circuit being comprised of an inductor and a pair of series connected capacitors connected across said inductor, a first transistor connected to said first resonant circuit to form a first oscillator; a second parallel circuit having a second resonant frequency, said second resonant circuit being comprised of an inductor and a pair of series connected capacitors connected across said inductor, a second transistor connected to said second resonant circuit to form a second oscillator, means for varying the resonant frequency of said second resonant circuit, heterodyning means comprising a third parallel resonant circuit broadly tuned to a third resonant frequency, a third transistor having a base, said third transistor being connected to said third resonant circuit, circuit means for applying signals produced by said first and second oscillators to the base of said third transistor, and an output terminal coupled to the third resonant circuit.

4. A transducer as defined in claim 3 in which said circuit means comprises a resistor common to the emitter circuits of said first and second transistors.

5. A transducer as defined in claim 3 in which said circuit means includes a conductor connected between the capacitors of the first resonant circuit and a coil inductively coupled to the inductor of the second resonant circuit.

References Cited in the file of this patent

UNITED STATES PATENTS

| | | |
|---|---|---|
| 2,110,082 | Granger | Mar. 1, 1938 |
| 2,600,396 | Ewen | June 17, 1952 |

OTHER REFERENCES

Article: Subaudio Oscillator Tunes to 0–50 Cycles, by Fleming et al., pps. 144–145 of Electronics for October 1955.

Page 370 and Figs. 10.31 (*a*) to (*d*) of Transistor Electronics by Lo et al. published by Prentice-Hall; 1955 edition.